(12) United States Patent
Liu et al.

(10) Patent No.: US 10,103,252 B2
(45) Date of Patent: Oct. 16, 2018

(54) VERTICAL JUNCTION FINFET DEVICE AND METHOD FOR MANUFACTURE

(71) Applicant: STMicroelectronics, Inc., Coppell, TX (US)

(72) Inventors: Qing Liu, Irvine, CA (US); John Hongguang Zhang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 4 days.

(21) Appl. No.: 15/361,935

(22) Filed: Nov. 28, 2016

(65) Prior Publication Data

US 2017/0077270 A1    Mar. 16, 2017

Related U.S. Application Data

(62) Division of application No. 14/677,404, filed on Apr. 2, 2015, now Pat. No. 9,543,304.

(51) Int. Cl.

| | |
|---|---|
| *H01L 27/085* | (2006.01) |
| *H01L 29/66* | (2006.01) |
| *H01L 27/098* | (2006.01) |
| *H01L 29/78* | (2006.01) |
| *H01L 29/808* | (2006.01) |
| *H01L 29/417* | (2006.01) |
| *H01L 29/10* | (2006.01) |
| *H01L 21/283* | (2006.01) |
| *H01L 29/06* | (2006.01) |

(52) U.S. Cl.
CPC ...... *H01L 29/66893* (2013.01); *H01L 21/283* (2013.01); *H01L 27/098* (2013.01); *H01L 29/0657* (2013.01); *H01L 29/1058* (2013.01); *H01L 29/1066* (2013.01); *H01L 29/41741* (2013.01); *H01L 29/41791* (2013.01); *H01L 29/66909* (2013.01); *H01L 29/7832* (2013.01); *H01L 29/8083* (2013.01)

(58) Field of Classification Search
CPC .............................. H01L 27/098; H01L 21/74
USPC .......................................... 257/265; 438/188
See application file for complete search history.

(56) References Cited

U.S. PATENT DOCUMENTS

| | | | |
|---|---|---|---|
| 6,153,453 A | 11/2000 | Jimenez | |
| 6,943,407 B2* | 9/2005 | Ouyang | .......... H01L 21/823807 257/329 |
| 8,502,280 B2* | 8/2013 | El-Kareh | ............ H01L 21/8232 257/262 |

(Continued)

OTHER PUBLICATIONS

First Office Action and Search Report for co-pending CN Appl. No. 201511021091.8 dated Jun. 5, 2018 (8 pages).

*Primary Examiner* — Jami V Miller
(74) *Attorney, Agent, or Firm* — Crowe & Dunlevy

(57) ABSTRACT

A vertical junction field effect transistor (JFET) is supported by a semiconductor substrate that includes a source region within the semiconductor substrate doped with a first conductivity-type dopant. A fin of semiconductor material doped with the first conductivity-type dopant has a first end in contact with the source region and further includes a second end and sidewalls between the first and second ends. A drain region is formed of first epitaxial material grown from the second end of the fin and doped with the first conductivity-type dopant. A gate structure is formed of second epitaxial material grown from the sidewalls of the fin and doped with a second conductivity-type dopant.

47 Claims, 9 Drawing Sheets

(56) References Cited

U.S. PATENT DOCUMENTS

| | | | | |
|---|---|---|---|---|
| 8,729,627 B2* | 5/2014 | Cheng | ............ | H01L 21/823807 |
| | | | | 257/288 |
| 8,785,285 B2* | 7/2014 | Tsai | ................ | H01L 29/66795 |
| | | | | 257/E21.409 |
| 8,969,963 B2* | 3/2015 | Basker | ................ | H01L 29/785 |
| | | | | 257/347 |
| 9,837,553 B1* | 12/2017 | Wu | ................ | H01L 29/78696 |
| 2005/0019993 A1* | 1/2005 | Lee | ................ | H01L 29/42384 |
| | | | | 438/157 |
| 2009/0008705 A1* | 1/2009 | Zhu | ................ | H01L 29/66795 |
| | | | | 257/327 |
| 2009/0294800 A1* | 12/2009 | Cheng | ............ | H01L 21/823412 |
| | | | | 257/192 |
| 2012/0052640 A1 | 3/2012 | Fischer et al. | | |
| 2014/0124842 A1* | 5/2014 | Wang | ................ | H01L 23/485 |
| | | | | 257/288 |
| 2014/0264575 A1* | 9/2014 | Tsai | ................ | H01L 29/66492 |
| | | | | 257/336 |
| 2014/0353760 A1* | 12/2014 | Loubet | ............ | H01L 21/823821 |
| | | | | 257/369 |
| 2015/0295089 A1* | 10/2015 | Huang | ................ | H01L 29/7853 |
| | | | | 257/401 |
| 2015/0372140 A1* | 12/2015 | Liu | ................ | H01L 29/7848 |
| | | | | 257/190 |
| 2016/0087070 A1* | 3/2016 | Machkaoutsan | .... | H01L 29/6681 |
| | | | | 257/192 |

* cited by examiner

VERTICAL JUNCTION FINFET DEVICE AND METHOD FOR MANUFACTURE

CROSS REFERENCE TO RELATED APPLICATION

This application is a divisional application from U.S. application Ser. No. 14/677,404 filed Apr. 2, 2015, the disclosure of which is incorporated by reference.

TECHNICAL FIELD

The present invention relates to integrated circuits and, in particular, to junction field effect transistor (JFET) devices fabricated using fins with vertical junctions.

BACKGROUND

The prior art teaches the formation of integrated circuits which utilize one or more junction field effect transistor (JFET) devices. The JFET device includes a junction formed under a gate conductor. Rather than use an insulated gate, as is conventional MOSFET-type devices, a field is applied by the junction acting as a gate. Current flows between the source and drain regions in a doped semiconductor region located under the gate. Through application of a voltage to the gate conductor, a region of depleted charge forms in the doped semiconductor region so as to pinch off the conducting path and restrict the flow of current. Because of the lack of available mobile charge, the depletion region behaves as an insulating structure.

The conventional JFET device is an attractive circuit for use in analog designs. The device is simple to form and operate. However, such JFET devices suffer from a noted drawback in that short channel effects are difficult to control. Additionally, the typical manufacture of JFET devices is incompatible with mainstream CMOS fabrication techniques. There is accordingly a need in the art to address the foregoing and other issues to provide a JFET device of improved configuration and operation, wherein manufacture of the device is compatible with CMOS techniques.

SUMMARY

In an embodiment, an integrated circuit transistor device comprises: a semiconductor substrate; a region within the semiconductor substrate doped with a first conductivity-type dopant; a fin of semiconductor material having a first end in contact with said region within the semiconductor substrate and having a second end and having sidewalls between said first and second ends, said fin doped with the first conductivity-type dopant; a first epitaxial region in contact with the second end of the fin of semiconductor material, said first epitaxial region doped with the first conductivity-type dopant; and a second epitaxial region in contact with sidewalls of the fin of semiconductor material, said second epitaxial region doped with a second conductivity-type dopant.

In an embodiment, a method comprises: implanting dopant of a first conductivity-type in a semiconductor substrate to form a first doped region; patterning the first doped region to define a fin having a first end and having a second end and having sidewalls between said first and second ends; implanting dopant of the first conductivity-type in the semiconductor substrate to form a second doped region in contact with the first end of the fin; epitaxially growing first semiconductor material to form a first epitaxial region in contact with the second end of the fin of semiconductor material, said first epitaxial region doped with the first conductivity-type dopant; and epitaxially growing second semiconductor material to form a second epitaxial region in contact with sidewalls of the fin of semiconductor material, said second epitaxial region doped with a second conductivity-type dopant.

In an embodiment, an integrated circuit comprises: a semiconductor substrate; a first region within the semiconductor substrate doped with a first conductivity-type dopant; a second region within the semiconductor substrate doped with a second conductivity-type dopant; a first fin of semiconductor material having a first end in contact with said first region within the semiconductor substrate and having a second end and having sidewalls between said first and second ends, said fin doped with the first conductivity-type dopant; a second fin of semiconductor material having a first end in contact with said second region within the semiconductor substrate and having a second end and having sidewalls between said first and second ends, said fin doped with the second conductivity-type dopant; a first epitaxial region in contact with the second end of the first fin of semiconductor material, said first epitaxial region doped with the first conductivity-type dopant; a second epitaxial region in contact with the second end of the second fin of semiconductor material, said second epitaxial region doped with the second conductivity-type dopant; a third epitaxial region in contact with sidewalls of the first fin of semiconductor material, said third epitaxial region doped with the second conductivity-type dopant; and a fourth epitaxial region in contact with sidewalls of the second fin of semiconductor material, said fourth epitaxial region doped with the first conductivity-type dopant.

In an embodiment, a method comprises: patterning a semiconductor substrate doped with a first conductivity-type to define a fin having a first end and having a second end and having sidewalls between said first and second ends; implanting dopant of the first conductivity-type in the semiconductor substrate to form a source region in contact with the first end of the fin; epitaxially growing first semiconductor material to form a drain region in contact with the second end of the fin of semiconductor material, said drain region doped with the first conductivity-type dopant; and epitaxially growing second semiconductor material to form a gate region in contact with sidewalls of the fin, said gate doped with a second conductivity-type dopant.

In an embodiment, a method comprises: defining a plurality of fins of a first conductivity-type, each fin supported at a first end by a support substrate and having a second end and having sidewalls between said first and second ends; doping the support substrate at the first ends of the plurality of fins with the first conductivity-type to define a source region in contact with the first ends of the plurality of fins; epitaxially growing semiconductor material on the sidewalls of the plurality of fins to form a gate region for each fin; epitaxially growing semiconductor material at the second ends of the plurality of fins to form a drain region for each fin; and forming electrical contacts to the source region, the gate regions and the drain regions.

BRIEF DESCRIPTION OF THE DRAWINGS

For a better understanding of the embodiments, reference will now be made by way of example only to the accompanying figures in which.

DETAILED DESCRIPTION

Reference is now made to FIGS. 1-15C which illustrate the process steps in the formation of a vertical junction FinFET device. It will be understood that the drawings do not necessarily show features drawn to scale.

Figure 1:
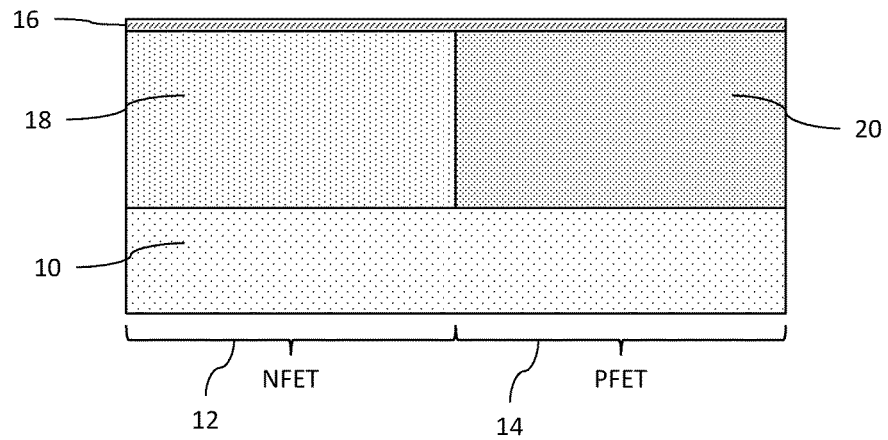
FIGS. 1-15C illustrate process steps in the formation of a vertical junction FinFET device, and in particular a plurality of such devices in a CMOS implementation.

FIG. 1 shows a conventional bulk semiconductor substrate 10 including an area 12 which is reserved for the formation of first polarity (n-channel) devices (NFET) and an area 14 which is reserved for the formation of second, opposite, polarity (p-channel) devices (PFET). A silicon dioxide ($SiO_2$) layer 16 is deposited, for example using a chemical vapor deposition (CVD) process, on the substrate 10 with a thickness of, for example, approximately 3 nm. Using lithographic techniques well known to those skilled in the art, area 14 is blocked off with an implant mask and an implant of n-type dopants (such as, for example, arsenic or phosphorous) is made in area 12 to define an n-type region 18. This implant may, for example, provide the region 18 with a dopant concentration of $1 \times 10^{18}$ to $5 \times 10^{18}$ at/cm$^3$. Using lithographic techniques well known to those skilled in the art, area 12 is blocked off with an implant mask and an implant of p-type dopants (such as, for example, boron) is made in area 14 to define a p-type region 20. This implant may, for example, provide the region 20 with a dopant concentration of $1 \times 10^{18}$ to $5 \times 10^{18}$ at/cm$^3$. The regions 18 and 20 have a depth, for example, of 50-80 nm.

Figure 2:
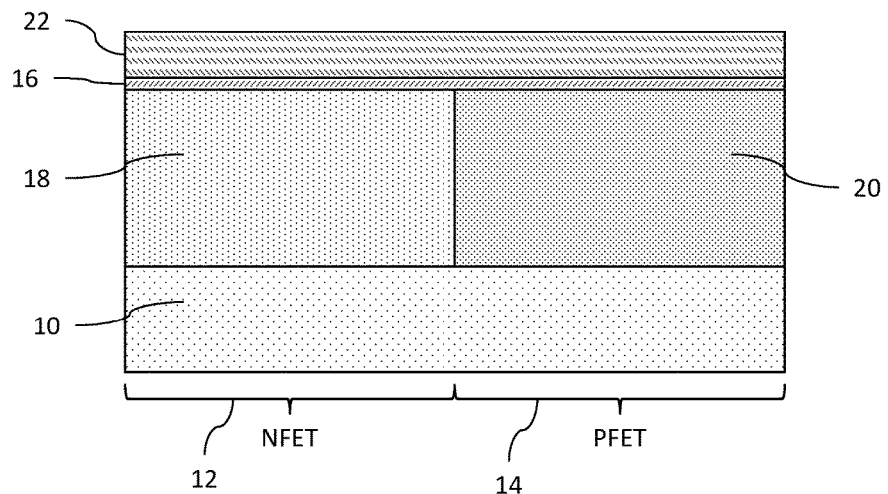

FIG. 2 shows the deposit of a silicon nitride (SiN) layer 22 over the silicon dioxide layer 16. This deposition may be made, for example, using a chemical vapor deposition (CVD) process to provide layer 22 with a thickness of 30-50 nm. This silicon nitride layer 22 forms a hard mask.

Figure 3:
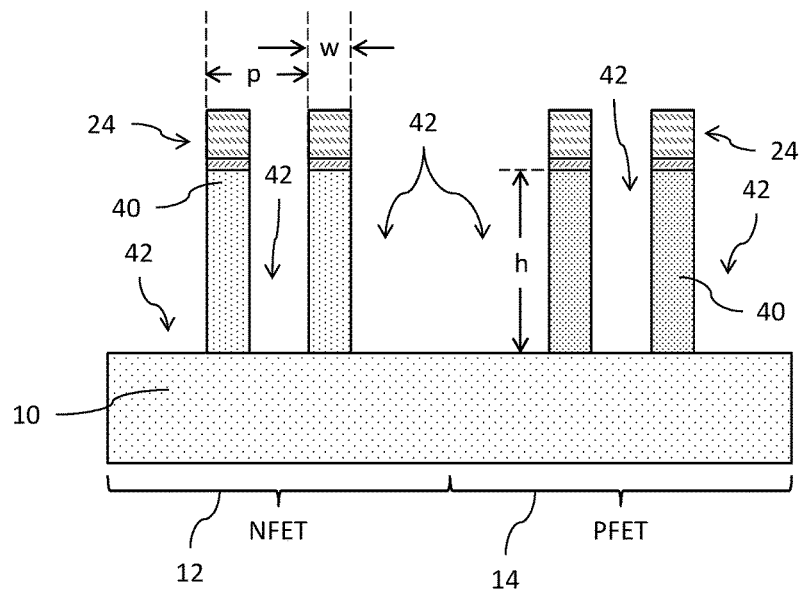

A lithographic process as known in the art is then used to define a plurality of fins 40 from the doped material of the regions 18 and 20. The hard mask is patterned to leave mask material 24 at the desired locations of the fins 40. An etching operation is then performed through the mask to open apertures 42 in the regions 18 and 20 of the substrate 10 on each side of each fin 40. The result of the etching process is shown in FIG. 3 with each fin 40 having a first end at the substrate and a distal second end. Each fin 40 may have a height (h) of 50-80 nm. In a preferred embodiment, the etch which defines the fins 40 extends to the full depth of the regions 18 and 20. In each of the areas 12 and 14, the fins 40 may have a width (w) of 6-15 nm and a pitch (p) of 20-50 nm.

Figure 4:
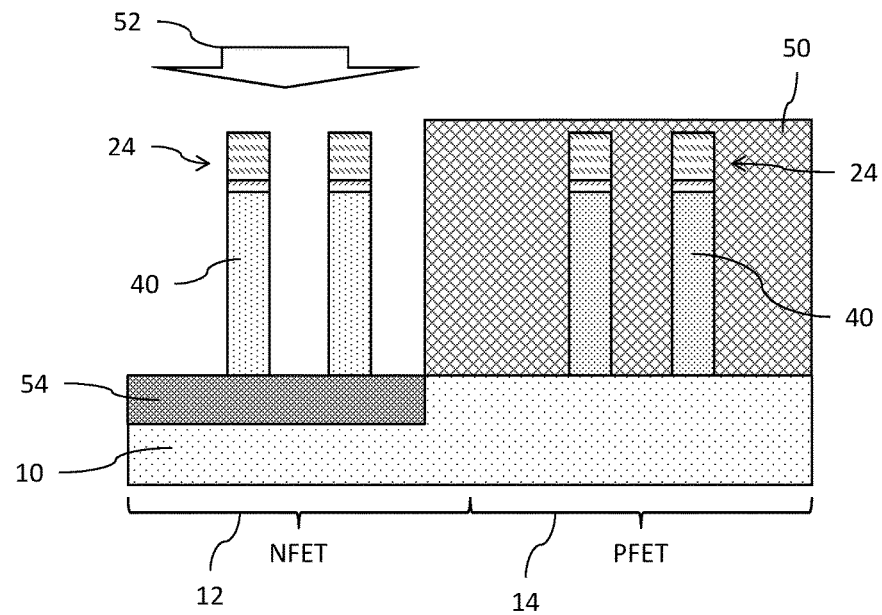

Next, the area 14 is blocked off (reference 50) and an implant 52 of n-type dopants (such as, for example, arsenic or phosphorous) is made in area 12 of the substrate 10 to define an n-type source region 54 in contact with the first ends of the fins 40 in area 12. This implant 52 may, for example, provide the source region 54 with a dopant concentration of $1 \times 10^{20}$ to $5 \times 10^{20}$ at/cm$^3$ which is in excess of the dopant concentration in each of the fins 40 located above the source region 54. The result is shown in FIG. 4. The blocking mask (reference 50) is then removed.

Figure 5:
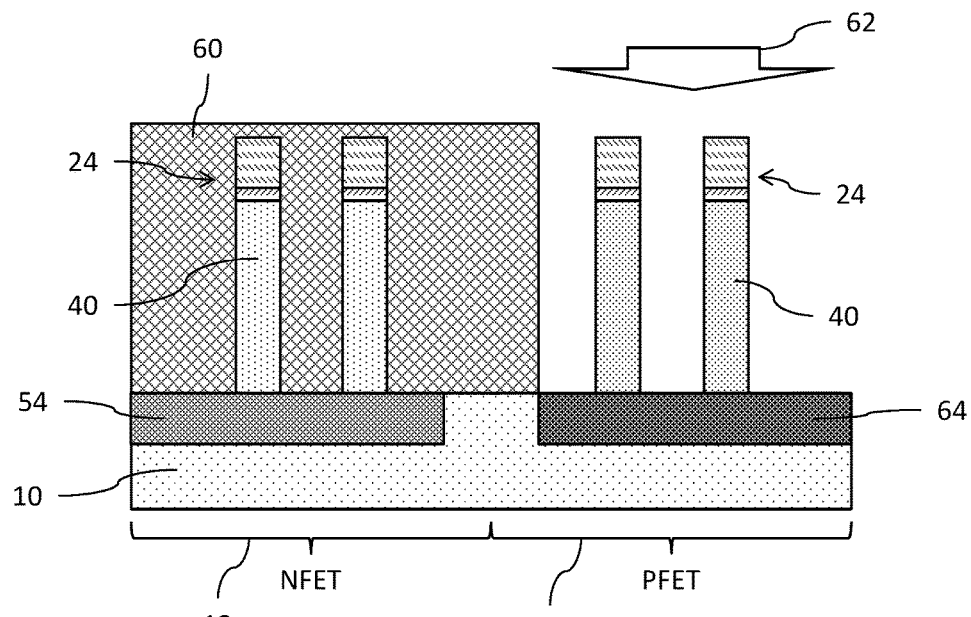
Figure 6:
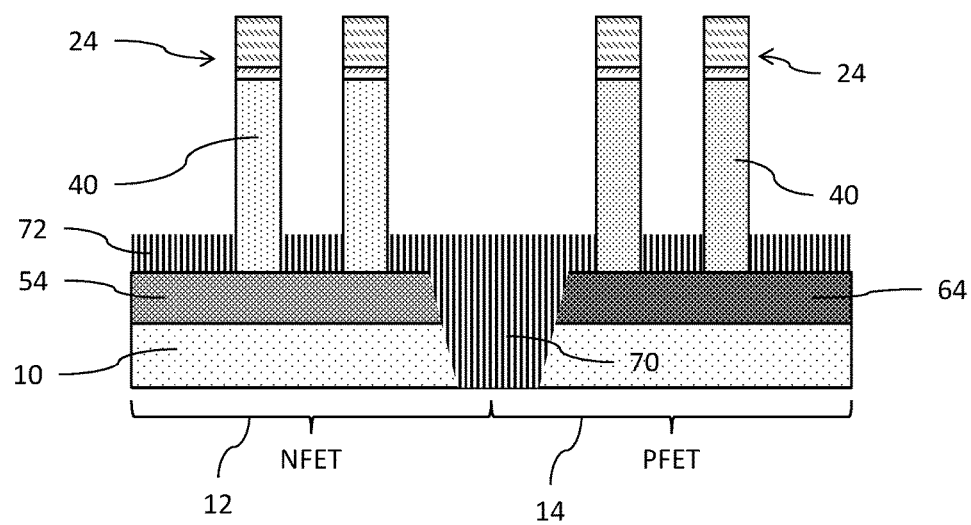

Next, the area 12 is blocked off (reference 60) and an implant 62 of p-type dopants (such as, for example, boron) is made in area 14 of the substrate 10 to define a p-type source region 64 in contact with the first ends of the fins 40 in area 14. This implant 62 may, for example, provide the source region 64 with a dopant concentration of $1 \times 10^{20}$ to $5 \times 10^{20}$ at/cm$^3$ which is in excess of the dopant concentration in each of the fins 40 located above the source region 64. The result is shown in FIG. 5. The blocking mask (reference 60) is then removed.

A shallow trench isolation (STI) structure 70 is then formed in the substrate 10 to separate the areas 12 and 14. The STI structure 70 may, for example, comprise silicon oxide material which fills a trench formed in the substrate 10. This insulation material further covers the source regions 54 and 64 in a layer 72 to locally insulate bottom portions of the fins 40 from each other. The local insulation layer 72 may, for example, have a thickness of 20-30 nm (thus leaving about 35-50 nm of each fin 40 exposed). The STI structure 70 may have a depth of approximately 200 nm.

Figure 7:
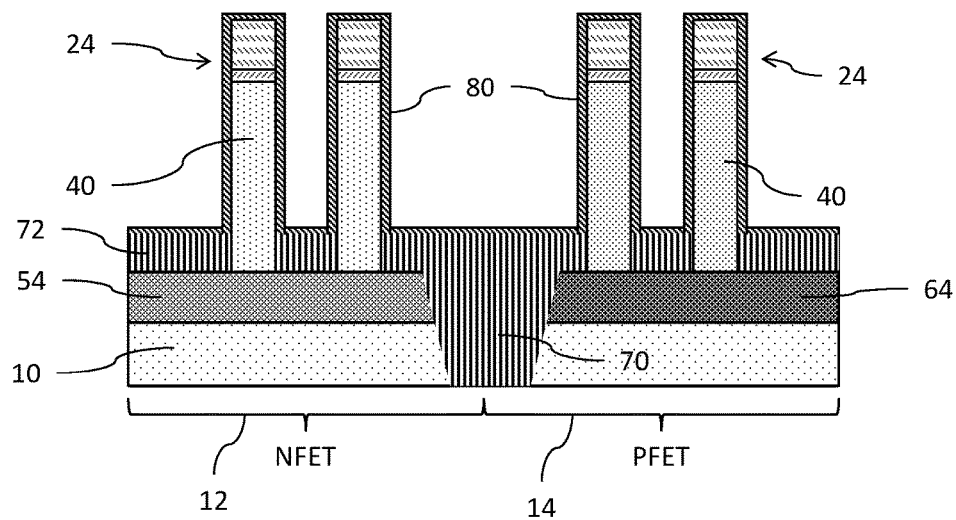

A silicon nitride liner 80 is then deposited to cover the fins 40. The deposition may, for example, be made using an atomic layer deposition (ALD) process. The liner 80 may, for example, have a thickness of 2-6 nm. The result is shown in FIG. 7.

Figure 8:
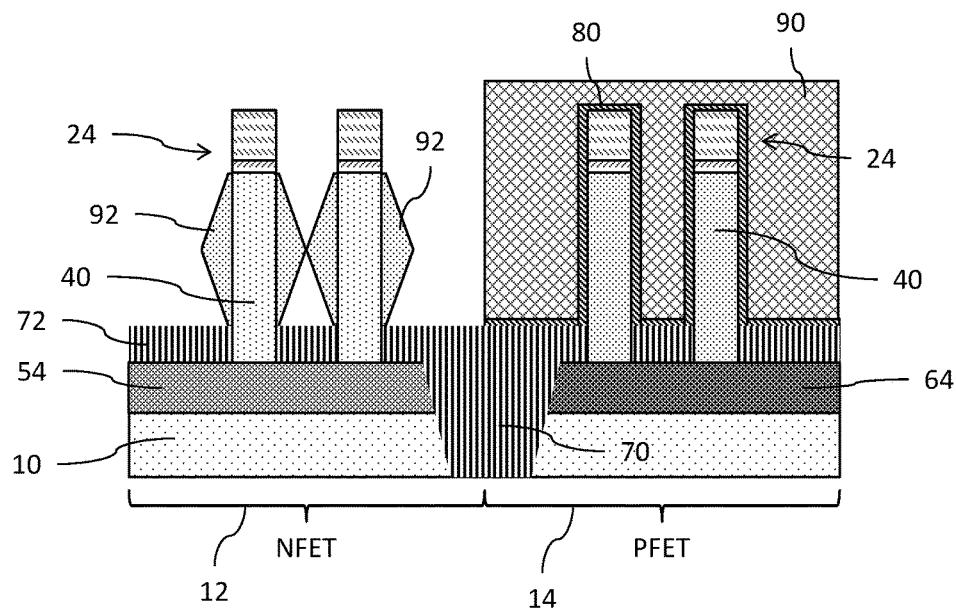

Next, the area 14 is blocked off (reference 90), the liner 80 is removed from the fins 40 in the area 12 (using any suitable wet or dry etch technique) to expose the sidewalls of the fins 40, and an epitaxial growth process as known in the art is performed to grow a silicon or silicon-germanium (SiGe) gate structure 92 from and in contact with the exposed sidewall surfaces of each fin 40. As the fins 40 in area 12 are of n-type, the epitaxially grown gate structures 92 are of p-type to form a p-n junction at the fin sidewalls. Preferably, the epitaxial growth is in situ doped with a suitable p-type dopant such as, for example, boron. The gate structures 92 may, for example, have a dopant concentration of $1 \times 10^{20}$ to $5 \times 10^{20}$ at/cm$^3$. The result of the epitaxial growth process is shown in FIG. 8. The blocking mask (reference 90) is then removed.

Figure 9:
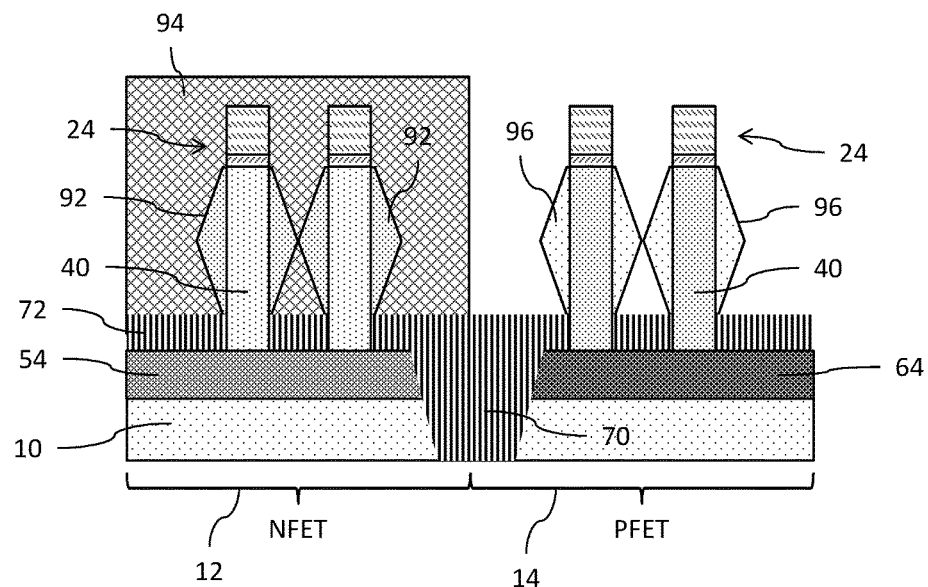

Next, the area 12 is blocked off (reference 94 including a new silicon nitride liner (not explicitly shown) on the gate structures 92), the liner 80 is removed from the fins 40 in the area 14 (using any suitable wet or dry etch technique) to expose the sidewalls of the fins 40, and an epitaxial growth process as known in the art is performed to grow a silicon or silicon-carbide (SiC) gate structure 96 from and in contact with the exposed sidewall surfaces of each fin 40. As the fins 40 in area 14 are of p-type, the epitaxially grown gate structures 96 are of n-type to form a p-n junction at the fin sidewalls. Preferably, the epitaxial growth is in situ doped with a suitable n-type dopant such as, for example, arsenic. The gate structures 96 may, for example, have a dopant concentration of $1 \times 10^{20}$ to $5 \times 10^{20}$ at/cm$^3$. The result of the epitaxial growth process is shown in FIG. 9. The blocking mask (reference 94, with the included silicon nitride liner) is then removed.

Figure 10:
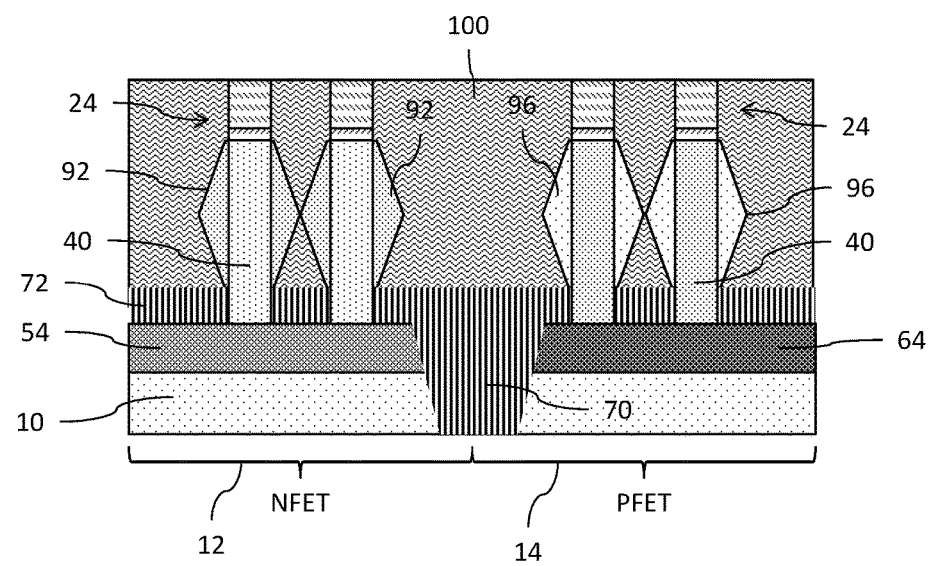

A layer 100 of an insulating material is then deposited on the substrate to height which at least exceeds the height of the mask material 24 present on top of each fin 40. The deposition process may, for example, comprise a chemical vapor deposition (CVD) of silicon dioxide. A chemical mechanical polishing is then performed to planarize a top surface of the layer 100 to a level which is coplanar with a top of the mask material 24. The result is shown in FIG. 10.

Figure 11:
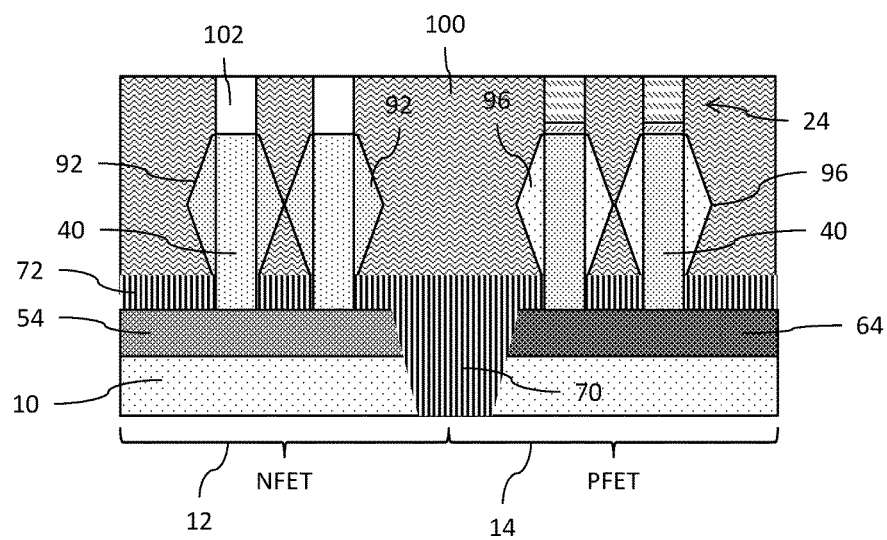

For the fins 40 in the area 12, the mask material 24 (remaining patterned portions of layers 16 and 22) is selectively removed to form openings 102 which expose the top surface at the distal second end of each fin 40. Prior to removal, a liner of silicon nitride (not explicitly shown) may be deposited using an atomic layer deposition (ALD) process in the area 14. The removal of the mask material 24 in area 12 may be accomplished using a selective etch (such as, for example, a hot phosphoric acid etch). The result is shown in FIG. 11.

Figure 12:
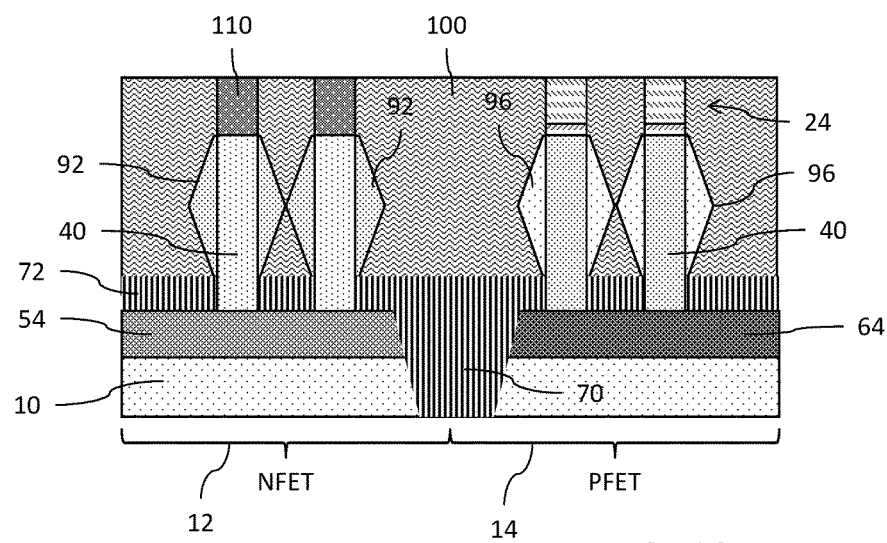

An epitaxial growth process as known in the art is then performed to grow a silicon or silicon-carbide (SiC) drain structure 110 from and in contact with the exposed top surface of each fin 40. As the fins 40 in area 12 are of n-type, the epitaxially grown drain structures 110 are also of n-type. Preferably, the epitaxial growth is in situ doped with a suitable n-type dopant such as, for example, phosphorous. The drain structures 110 may, for example, have a dopant concentration of $1 \times 10^{20}$ to $5 \times 10^{20}$ at/cm$^3$ which is in excess of the dopant concentration for the fins 40 in area 12. The result of the epitaxial growth process is shown in FIG. 12.

Figure 13:
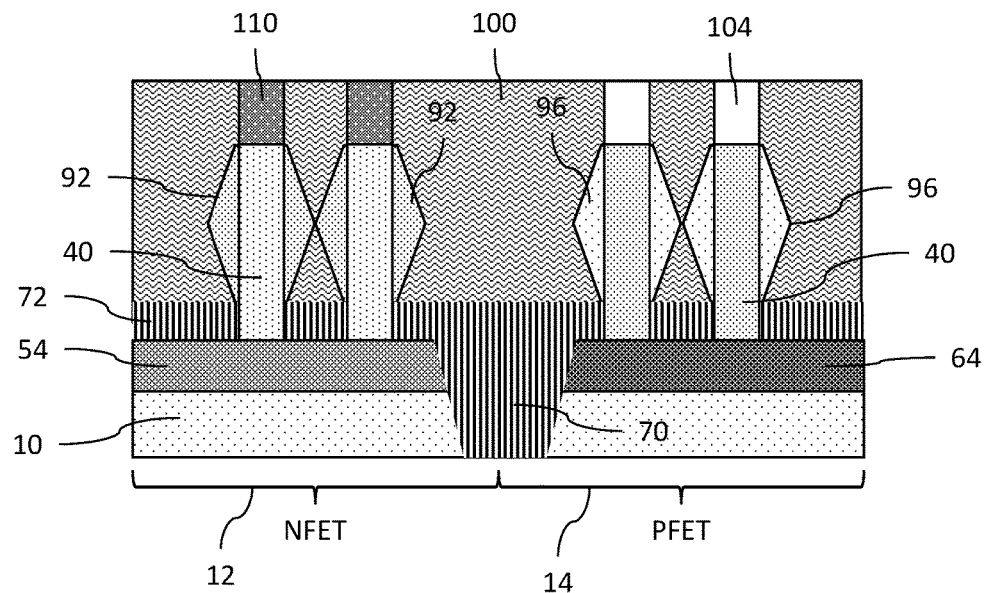

For the fins 40 in the area 14, the mask material 24 (remaining patterned portions of layers 16 and 22) is selectively removed to form openings 104 which expose the top surface at the distal second end of each fin 40. Prior to removal, a liner of silicon nitride (not explicitly shown) may be deposited using an atomic layer deposition (ALD) process in the area 12. The removal of the mask material 24 in area 14 may be accomplished using a selective etch (such as, for example, a hot phosphoric acid etch). The result is shown in FIG. 13.

Figure 14:
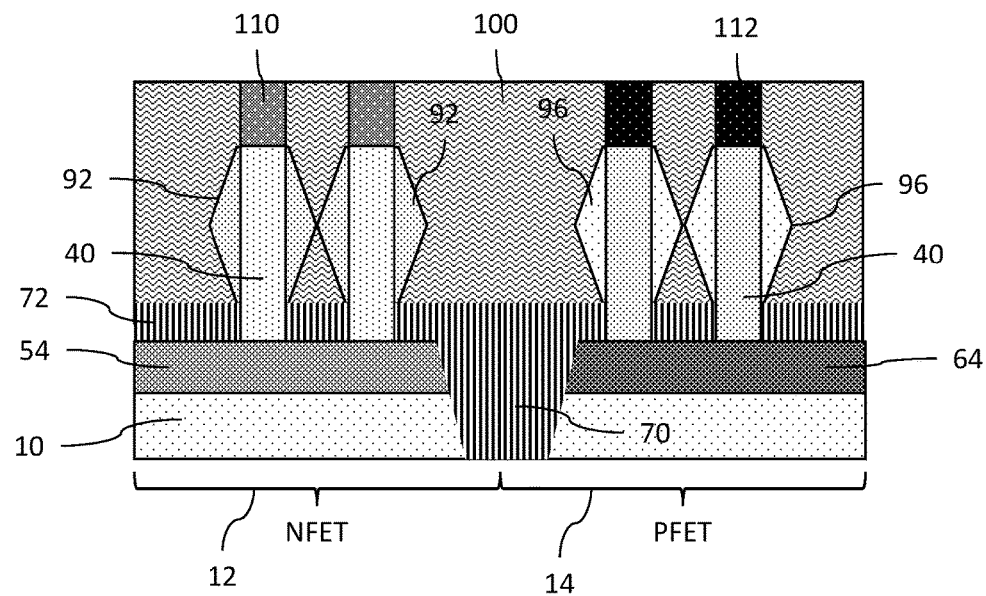

An epitaxial growth process as known in the art is then performed to grow a silicon or silicon-germanium (SiGe) drain structure 112 from and in contact with the exposed top surface of each fin 40. As the fins 40 in area 14 are of p-type, the epitaxially grown drain structures 112 are also of p-type. Preferably, the epitaxial growth is in situ doped with a suitable p-type dopant such as, for example, boron. The drain structures 112 may, for example, have a dopant concentration of $1 \times 10^{20}$ to $5 \times 10^{20}$ at/cm$^3$ which is in excess of the dopant concentration for the fins 40 in area 14. The result of the epitaxial growth process is shown in FIG. 14.

Figure 15A:
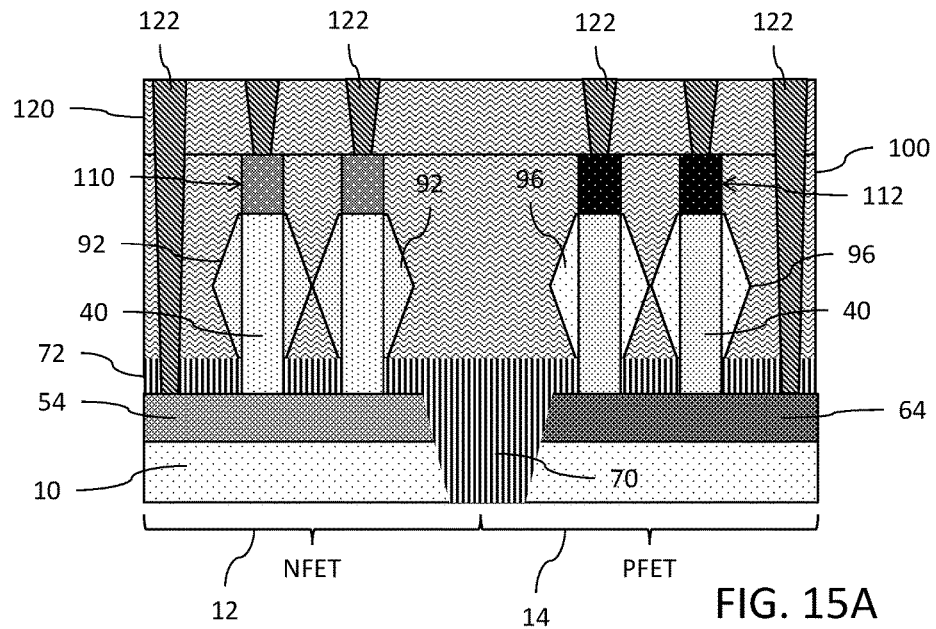
Figure 15B:
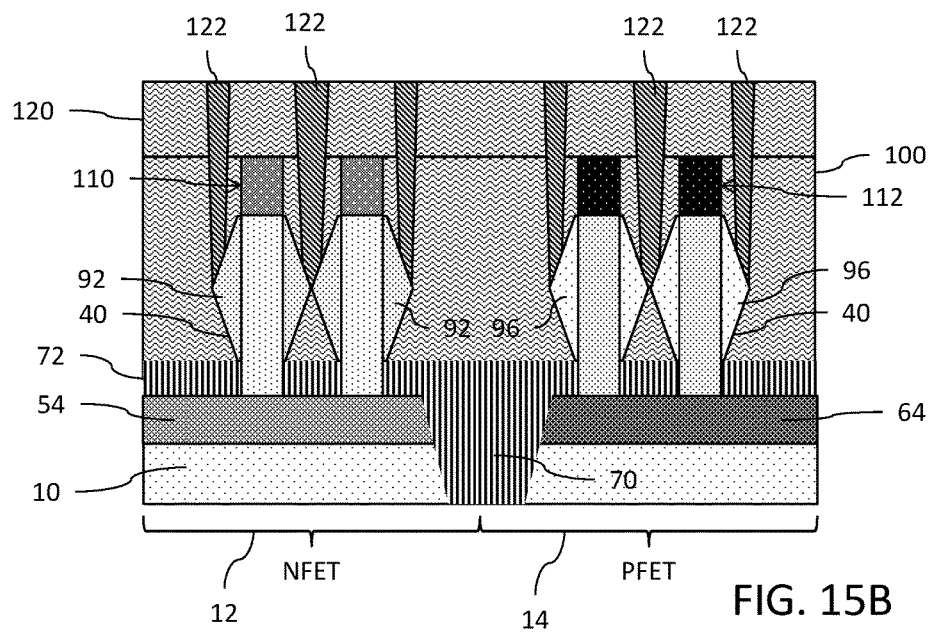
Figure 15C:
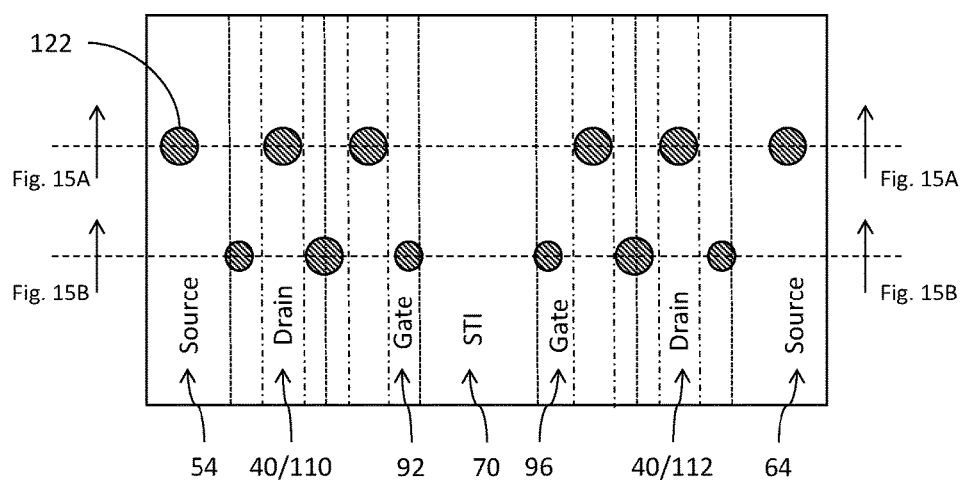

A premetal dielectric (PMD) layer 120 is then deposited on top of the layer 100 of an insulating material. The layer 120 may, for example, comprise silicon dioxide deposited using a chemical vapor deposition process to a thickness of 50-500 nm. Electrical contacts 122 to the gate structures 92 and 94, the source regions 54 and 64 and the drain regions 110 and 112 are them formed using conventional etch and fill techniques known to those skilled in the art. The metal used for the contacts 122 may, for example, comprise tungsten. The contacts 122 for the gate structures 92 and 94 may be offset from the contacts 122 for the source regions 54 and 64 and the drain regions 110 and 112 as shown in FIGS. 15A-15C.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
   patterning a semiconductor substrate doped with a first conductivity-type to define a fin having a first end and having a second end and having sidewalls between said first and second ends;
   implanting dopant of the first conductivity-type in the semiconductor substrate to form a source region in contact with the first end of the fin;
   epitaxially growing first semiconductor material to form a drain region in contact with the second end of the fin of semiconductor material, said drain region doped with the first conductivity-type dopant; and
   epitaxially growing second semiconductor material to form a gate region in contact with sidewalls of the fin, said gate region doped with a second conductivity-type dopant.

2. The method of claim 1, wherein the first semiconductor material is selected from the group consisting of silicon, silicon-germanium and silicon-carbide.

3. The method of claim 1, wherein the second semiconductor material is selected from the group consisting of silicon, silicon-germanium and silicon-carbide.

4. The method of claim 1, further comprising:
   forming an insulating material surrounding the fin;
   forming a source contact extending through the insulating material to reach the source region;
   forming a drain contact extending through the insulating material to reach the drain region; and
   forming a gate contact extending through the insulating material to reach the gate region.

5. The method of claim 1, wherein patterning the semiconductor substrate comprises:
   forming a hard mask layer;
   patterning the hard mask layer to define a mask; and
   etching through the mask to define the fin.

6. The method of claim 5, wherein epitaxially growing first semiconductor material comprises:
   forming an insulating material surrounding the fin;
   removing the mask to expose a surface at the second end of the fin; and
   expitaxially growing the first semiconductor material from the exposed surface.

7. The method of claim 1, wherein the first conductivity-type dopant is n-type and the second conductivity-type dopant is p-type.

8. The method of claim 1, wherein the first conductivity-type dopant is p-type and the second conductivity-type dopant is n-type.

9. The method of claim 1, wherein a dopant concentration of the source region exceeds a dopant concentration of the semiconductor substrate.

10. The method of claim 1, wherein a dopant concentration of the source region exceeds a dopant concentration of the fin.

11. The method of claim 1, wherein patterning defines a plurality of fins, further comprising depositing a layer of insulating material on the source region to isolate bottom portions of each fin of the plurality of fins from each other.

12. A method, comprising
   implanting dopant of a first conductivity-type in a semiconductor substrate to form a first doped region;
   patterning the first doped region to define a fin having a first end and having a second end and having sidewalls between said first and second ends;
   implanting dopant of the first conductivity-type in the semiconductor substrate to form a source region in contact with the first end of the fin, wherein a dopant concentration of the source region exceeds a dopant concentration of the fin;
   epitaxially growing first semiconductor material to form an epitaxial drain region in contact with the second end of the fin of semiconductor material, said epitaxial drain region doped with the first conductivity-type dopant, wherein a dopant concentration of the first epitaxial region exceeds the dopant concentration of the fin; and epitaxially growing second semiconductor material to form an epitaxial gate region in contact with sidewalls of the fin of semiconductor material, said second epitaxial region doped with a second conductivity-type dopant.

13. The method of claim 12, wherein the first semiconductor material is selected from the group consisting of silicon, silicon-germanium and silicon-carbide.

14. The method of claim 12, wherein the second semiconductor material is selected from the group consisting of silicon, silicon-germanium and silicon-carbide.

15. The method of claim 12, further comprising:
forming an insulating material surrounding the fin;
forming a source contact extending through the insulating material to reach the source region;
forming a drain contact extending through the insulating material to reach the epitaxial drain region; and
forming a gate contact extending through the insulating material to reach the epitaxial gate region.

16. The method of claim 12, wherein patterning the first doped region comprises:
forming a hard mask layer on the first doped region;
patterning the hard mask layer to define a mask; and
etching through the mask to define the fin.

17. The method of claim 16, wherein epitaxially growing first semiconductor material comprises:
forming an insulating material surrounding the fin;
removing the mask to expose a surface at the second end of the fin; and
expitaxially growing the first semiconductor material from the exposed surface.

18. The method of claim 12, wherein the first conductivity-type dopant is n-type and the second conductivity-type dopant is p-type.

19. The method of claim 12, wherein the first conductivity-type dopant is p-type and the second conductivity-type dopant is n-type.

20. The method of claim 12, wherein patterning the first doped region defines a plurality of fins, further comprising depositing a layer of insulating material on the second doped region to isolate bottom portions of each fin of the plurality of fins from each other.

21. A method, comprising:
defining a plurality of fins of a first conductivity-type, each fin supported at a first end by a support substrate and having a second end and having sidewalls between said first and second ends;
doping the support substrate at the first ends of the plurality of fins with the first conductivity-type to define a source region in contact with the first ends of the plurality of fins;
epitaxially growing semiconductor material on the sidewalls of the plurality of fins to form a gate region for each fin;
epitaxially growing semiconductor material at the second ends of the plurality of fins to form a drain region for each fin; and
forming electrical contacts to the source region, the gate regions and the drain regions.

22. The method of claim 21, wherein the first conductivity-type dopant is n-type and the second conductivity-type dopant is p-type.

23. The method of claim 21, wherein the first conductivity-type dopant is p-type and the second conductivity-type dopant is n-type.

24. The method of claim 21, wherein the semiconductor material on the sidewalls is selected from the group consisting of silicon, silicon-germanium and silicon-carbide.

25. The method of claim 21, wherein the semiconductor material at the second ends is selected from the group consisting of silicon, silicon-germanium and silicon-carbide.

26. The method of claim 21, wherein forming electrical contacts comprises:
forming an insulating material surrounding the fins;
forming a source contact extending through the insulating material to reach the source region;
forming drain contacts extending through the insulating material to reach the drain regions; and
forming gate contacts extending through the insulating material to reach the gate regions.

27. The method of claim 21, wherein defining the plurality of fins comprises patterning a semiconductor substrate.

28. The method of claim 21, wherein a dopant concentration of the source region exceeds a dopant concentration of the semiconductor substrate.

29. The method of claim 21, wherein a dopant concentration of the source region exceeds a dopant concentration of the fin.

30. A method, comprising:
implanting dopant of a first conductivity-type in a semiconductor substrate to form a first doped region;
patterning the first doped region to define a fin having a first end and having a second end and having sidewalls between said first and second ends;
implanting dopant of the first conductivity-type in the semiconductor substrate to form a second doped region in contact with the first end of the fin;
epitaxially growing first semiconductor material to form a first epitaxial region in contact with the second end of the fin of semiconductor material, said first epitaxial region doped with the first conductivity-type dopant; and
epitaxially growing second semiconductor material to form a second epitaxial region in contact with sidewalls of the fin of semiconductor material, said second epitaxial region doped with a second conductivity-type dopant;
forming an insulating material surrounding the fin;
forming a source contact extending through the insulating material to reach the second doped region;
forming a drain contact extending through the insulating material to reach the first epitaxial region; and
forming a gate contact extending through the insulating material to reach the second epitaxial region.

31. The method of claim 30, wherein a dopant concentration of the second doped region exceeds a dopant concentration of the fin formed from the first doped region.

32. The method of claim 30, wherein the first semiconductor material is selected from the group consisting of silicon, silicon-germanium and silicon-carbide.

33. The method of claim 30, wherein the second semiconductor material is selected from the group consisting of silicon, silicon-germanium and silicon-carbide.

34. The method of claim 30, wherein patterning the first doped region comprises:
forming a hard mask layer on the first doped region;
patterning the hard mask layer to define a mask; and
etching through the mask to define the fin.

35. The method of claim 34, wherein epitaxially growing first semiconductor material comprises:
forming an insulating material surrounding the fin;
removing the mask to expose a surface at the second end of the fin; and
expitaxially growing the first semiconductor material from the exposed surface.

36. The method of claim 30, wherein the first conductivity-type dopant is n-type and the second conductivity-type dopant is p-type.

37. The method of claim 30, wherein the first conductivity-type dopant is p-type and the second conductivity-type dopant is n-type.

38. The method of claim 30, wherein a dopant concentration of the second doped region exceeds a dopant concentration of the fin formed from the first doped region.

39. The method of claim 30, wherein a dopant concentration of the second epitaxial region exceeds a dopant concentration of the fin formed from the first doped region.

40. The method of claim 30, wherein patterning the first doped region defines a plurality of fins, further comprising depositing a layer of insulating material on the second doped region to isolate bottom portions of each fin of the plurality of fins from each other.

41. A method, comprising:
implanting dopant of a first conductivity-type in a semiconductor substrate to form a first doped region;
patterning the first doped region to define a fin having a first end and having a second end and having sidewalls between said first and second ends, wherein patterning the first doped region comprises:
forming a hard mask layer on the first doped region;
patterning the hard mask layer to define a mask; and
etching through the mask to define the fin;
implanting dopant of the first conductivity-type in the semiconductor substrate to form a second doped region in contact with the first end of the fin;
epitaxially growing first semiconductor material to form a first epitaxial region in contact with the second end of the fin of semiconductor material, said first epitaxial region doped with the first conductivity-type dopant, wherein epitaxially growing first semiconductor material comprises:
forming an insulating material surrounding the fin;
removing the mask to expose a surface at the second end of the fin; and
expitaxially growing the first semiconductor material from the exposed surface; and
epitaxially growing second semiconductor material to form a second epitaxial region in contact with sidewalls of the fin of semiconductor material, said second epitaxial region doped with a second conductivity-type dopant.

42. The method of claim 41, wherein the first semiconductor material is selected from the group consisting of silicon, silicon-germanium and silicon-carbide.

43. The method of claim 41, wherein the second semiconductor material is selected from the group consisting of silicon, silicon-germanium and silicon-carbide.

44. The method of claim 41, wherein the first conductivity-type dopant is n-type and the second conductivity-type dopant is p-type.

45. The method of claim 41, wherein the first conductivity-type dopant is p-type and the second conductivity-type dopant is n-type.

46. The method of claim 41, wherein a dopant concentration of the second epitaxial region exceeds a dopant concentration of the fin formed from the first doped region.

47. The method of claim 41, wherein patterning the first doped region defines a plurality of fins, further comprising depositing a layer of insulating material on the second doped region to isolate bottom portions of each fin of the plurality of fins from each other.

* * * * *